United States Patent
Matsuda

(10) Patent No.: US 7,651,922 B2
(45) Date of Patent: Jan. 26, 2010

(54) SEMICONDUCTOR DEVICE FABRICATION METHOD

(75) Inventor: Taketo Matsuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

(21) Appl. No.: 11/948,211

(22) Filed: Nov. 30, 2007

(65) Prior Publication Data
US 2008/0206956 A1 Aug. 28, 2008

(30) Foreign Application Priority Data
Feb. 26, 2007 (JP) ............................. 2007-044892

(51) Int. Cl.
*H01L 21/76* (2006.01)
(52) U.S. Cl. ................ 438/427; 438/424; 257/E21.548
(58) Field of Classification Search ................ 438/424, 438/427; 257/E21.546, E21.548
See application file for complete search history.

(56) References Cited

U.S. PATENT DOCUMENTS

| | | | | |
|---|---|---|---|---|
| 5,637,539 | A * | 6/1997 | Hofmann et al. ............... | 438/20 |
| 5,728,621 | A | 3/1998 | Zheng et al. | |
| 6,001,696 | A * | 12/1999 | Kim et al. .................... | 438/296 |
| 6,048,775 | A | 4/2000 | Yao et al. | |
| 6,248,667 | B1 * | 6/2001 | Kim et al. .................... | 438/690 |
| 6,270,353 | B1 * | 8/2001 | Andrews et al. ............ | 434/424 |
| 6,319,796 | B1 * | 11/2001 | Laparra et al. ............... | 438/435 |
| 6,331,472 | B1 * | 12/2001 | Liu et al. ...................... | 438/424 |
| 6,391,792 | B1 * | 5/2002 | Jang et al. .................... | 438/734 |
| 6,399,461 | B1 * | 6/2002 | Liu et al. ..................... | 438/436 |
| 6,448,150 | B1 * | 9/2002 | Tsai et al. .................... | 438/427 |
| 6,461,932 | B1 * | 10/2002 | Wang .......................... | 438/400 |
| 6,541,349 | B2 * | 4/2003 | Arthanari et al. ............ | 438/424 |
| 6,596,653 | B2 | 7/2003 | Tan et al. | |
| 6,596,654 | B1 | 7/2003 | Bayman et al. | |
| 7,256,100 | B2 * | 8/2007 | Ogasawara .................. | 438/427 |
| 2003/0104676 | A1 | 6/2003 | Dai et al. | |
| 2007/0128865 | A1 | 6/2007 | Sato et al. | |

* cited by examiner

*Primary Examiner*—Walter L Lindsay, Jr.
(74) *Attorney, Agent, or Firm*—Finnegan, Henderson, Farabow, Garrett & Dunner, L.L.P.

(57) ABSTRACT

A method for fabricating a semiconductor device, includes forming a silicon nitride film on a base body, forming a silicon film on said silicon nitride film, forming at least one groove extending from said silicon film to inside of said base body, forming by high-density plasma-enhanced chemical vapor deposition a silicon-containing dielectric film in said groove and on said silicon film in such a way that a silicon-rich layer is formed at a height position spaced apart from said base body within said groove, said silicon-rich layer being higher in silicon content than remaining silicon-containing dielectric film, removing by etching a portion of said silicon-containing dielectric film above said silicon film and a portion of said remaining silicon-containing dielectric film above said silicon-rich layer, if any, and after having removed said silicon-containing dielectric film, removing by etching said silicon-rich layer and said silicon film.

20 Claims, 10 Drawing Sheets

SEMICONDUCTOR DEVICE FABRICATION METHOD

CROSS-REFERENCE TO RELATED APPLICATION

This application claims priority from Japanese Patent Application No. 2007-044892, filed Feb. 26, 2007, the disclosure of which is incorporated herein by reference.

FIELD OF THE INVENTION

The present invention relates in general to semiconductor device fabrication methodology and, in more particular, to a process of making a shallow trench isolation (STI) structure adaptable for use in highly integrated semiconductor circuit devices.

DESCRIPTION OF RELATED ART

A known method for forming an STI structure includes the steps of preparing a silicon (Si) substrate having a top surface on which a silicon nitride ($Si_3N_4$) film (referred to hereinafter as SiN film), forming in the surface of this substrate a plurality of vertical grooves, called the trenches, and forming a silicon oxide ($SiO_2$) film having portions buried in these trenches. Extra portions that are protruded from these STI trenches are removed by chemical mechanical polish (CMP) techniques to thereby planarize the top surface of resultant device structure. The STI structure thus formed can also have a "narrow" trench with a ratio of groove depth to opening width (i.e., aspect ratio) being one (1) or greater. To bury an $SiO_2$ film in this kind of trench, inductively coupled plasma-assisted chemical vapor deposition (CVD) or high-density plasma-enhanced CVD (HDP-CVD) techniques are typically used. When doing so, the buried layer is formed by execution of sputtering while at the same time performing deposition. Usually, a film fabrication technique is used which employs as process gases a hydrogen ($H_2$) gas in addition to monosilane ($SiH_4$) and oxygen ($O_2$) gases. Examples of this fabrication method are disclosed, for example, in U.S. Pat. Nos. 6,596,653 and 6,596,654. Using $H_2$ makes it possible to achieve the intended film formation while suppressing unwanted opening blockage or obstruction at upper ends of trenches otherwise occurring due to the so-called overhang, thereby to improve buriability with respect to the trenches.

In the inductive coupled plasma CVD process, both the film deposition and the sputtering are performed at a time. Thus, a SiN film which was formed at upper parts on both is sides of a trench can experience occurrence of undesired rounding, called the "clipping." This clipping takes place saliently, in particular, at a narrow portion between neighboring trenches. In view of the fact that the SiN film functions as a CMP stop layer during planarization using CMP techniques, the clipping poses a problem as to the loss of this function. As a result, a dielectric film which was formed in such narrow region between trenches is over-polished to have an unintentionally shallow depth width that is less than that of a region which is relatively great in width between other trenches. This causes a problem that the dielectric film formed becomes variable and irregular in thickness. Accordingly, it is needed to provide a technique capable of forming the STI trench structure so that its trench insulator film has a uniform thickness irrespective of whether the trench is wide or narrow.

BRIEF SUMMARY OF THE INVENTION

In accordance with one aspect of this invention, a method for fabricating a semiconductor device is provided, which includes forming a first silicon nitride film on a base body, forming a silicon film on said first silicon nitride film, forming a second silicon nitride film on said silicon film, forming at least one groove extending from said second silicon nitride film to inside of said base body, forming by high-density plasma-enhanced chemical vapor deposition a silicon-containing dielectric film in said groove and on said second silicon nitride film in such a way that a silicon-rich layer is formed at a height position spaced apart from said base body within said groove, said silicon-rich layer being higher in silicon content than remaining silicon-containing dielectric film, removing by etching a portion of said silicon-containing dielectric film above said second silicon nitride film and a portion of said remaining silicon-containing dielectric film above said silicon-rich layer, if any, after having removed said silicon-containing dielectric film, removing by etching said second silicon nitride film, and after having removed said second silicon nitride film, removing by etching said silicon-rich layer and said silicon film.

In accordance with another aspect of the invention, a method for fabricating a semiconductor device, includes forming a silicon nitride film on a base body, forming a silicon film on said silicon nitride film, forming at least one groove extending from said silicon film to inside of said base body, forming by high-density plasma-enhanced chemical vapor deposition a silicon-containing dielectric film in said groove and on said silicon film in such a way that a silicon-rich layer is formed at a height position spaced apart from said base body within said groove, said silicon-rich layer being higher in silicon content than remaining silicon-containing dielectric film, removing by etching a portion of said silicon-containing dielectric film above said silicon film and a portion of said remaining silicon-containing dielectric film above said silicon-rich layer, if any, and after having removed said silicon-containing dielectric film, removing by etching said silicon-rich layer and said silicon film.

DETAILED DESCRIPTION OF THE INVENTION

In high-density plasma-enhanced chemical vapor deposition (HDP-CVD) methodology, film fabrication is performed by using a hydrogen ($H_2$) gas. In order to improve the insulator burying capability or "buriability" with respect to narrow trench-like grooves, an attempt is usually made to relatively reduce the flow rate of an oxygen ($O_2$) gas. In doing so, a film being presently formed can sometimes vary in composition although film-forming process parameters are kept unchanged, such as the process gas flow rate or the like. This occurs because of the fact that during the film formation, combination or "bonding" of silicon and silicon (Si—Si) is created in addition to a bond of silicon and oxygen (Si—O), which are constituent components of an $SiO_2$ film. This results in formation of an oxygen-deficient insulator composition—typically silicon oxide, i.e., $SiO_x$, where the suffix "x" is 2 or less. In other words, a dielectric film with silicon being excessively contained therein relative to oxygen—say, "silicon-rich" dielectric film—is formed unintentionally. Once this Si-rich film is formed, the resulting film becomes much similar in quality to polycrystalline silicon (poly-Si). Thus, the $SiO_2$ film formed becomes less processable or "grindable" by planarization using known chemical mechanical polish (CMP) techniques. This polishing difficultly results in extra portions of Si-rich film being left within the trenches, which leads to risks as to degradation of electrical insulation characteristics. In accordance with embodiments of this invention, a technique is provided for properly controlling the formation position and the thickness of such Si-rich film to thereby permit successful planarization of the dielectric film in STI structure. A method for fabricating a semiconductor device having a buried dielectric film with enhanced thickness uniformity by use of the planarization technique will be described based on some illustrative embodiments of the invention below.

EMBODIMENT 1

In this embodiment, a multilayer structure is formed on or above a semiconductive substrate for use as a base body, which structure includes two, upper and lower SiN films and a poly-Si film interposed between the SiN films. Then, with this multilayer structure being as a mask, trench-like grooves are formed. Next, by HDP-CVD a film made of dielectric material, such as $SiO_2$, which covers the trenches is formed. At this time, an oxygen-deficient film, i.e., Si-rich layer, is deposited at a position which is above the substrate and at a position below a top surface of the upper SiN film.

Figure 1:
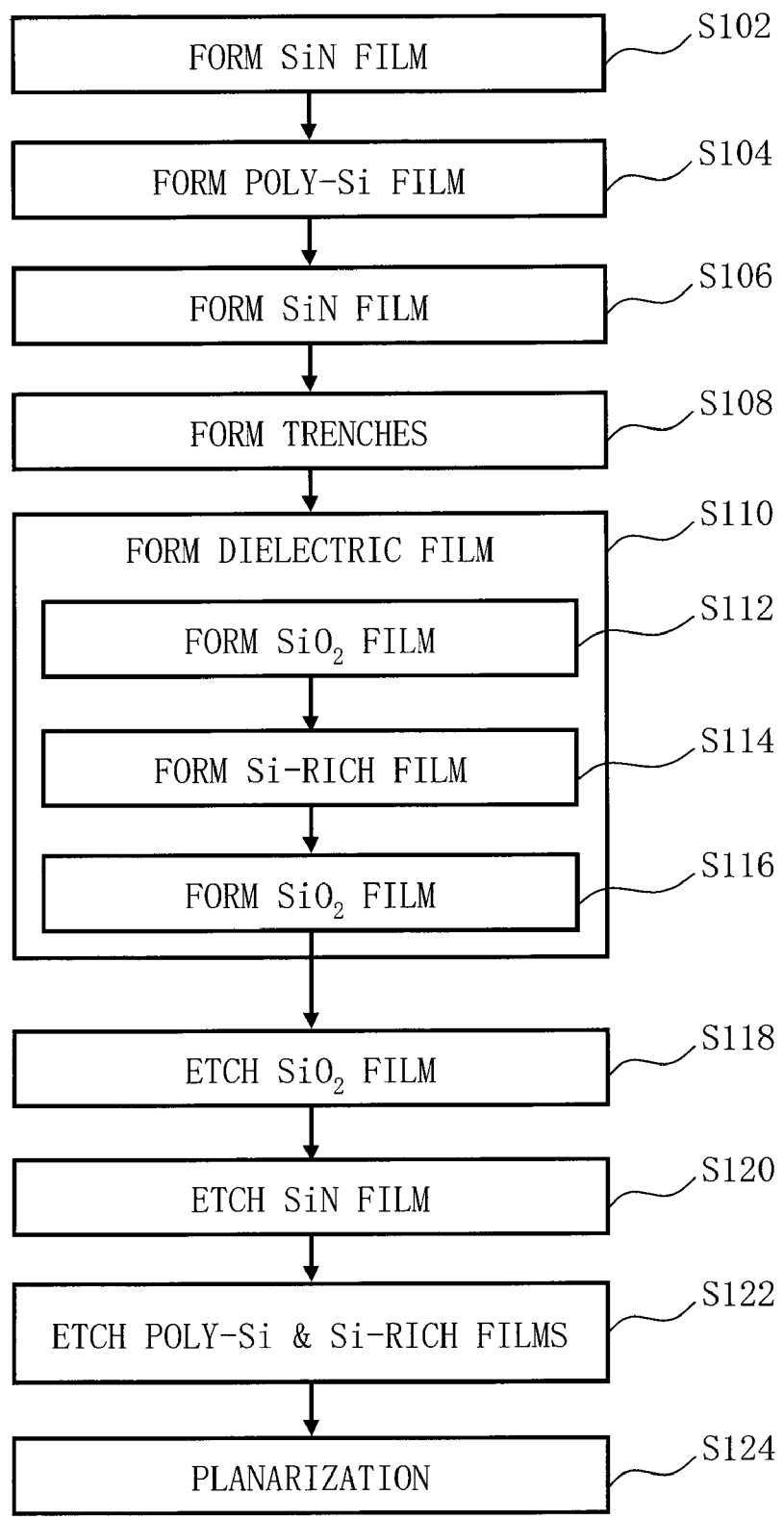
FIG. 1 is a flow diagram showing major process steps of a semiconductor device fabrication method in accordance with one embodiment of this invention.

More specifically, as shown in FIG. 1, this embodiment method includes a series of process steps which follow: a SiN film formation step S102, poly-Si film formation step S104, SiN film formation step S106, groove defining step S108, dielectric film formation step S110, $SiO_2$ film etching step S118, SiN film etching step S120, poly-Si and Si-rich film etching step S122, and planarization step S124. The dielectric film formation step S110 includes a series of sub-steps, such as an $SiO_2$ film formation step S112, Si-rich layer forming step S114, and Si-rich layer formation step S116.

FIGS. 2A to 2D illustrate, in cross-section, device structures which are obtained at some of the process steps shown in the flow chart of FIG. 1, i.e., the SiN film formation step S102 to the groove defining step S108.

Figure 2A:
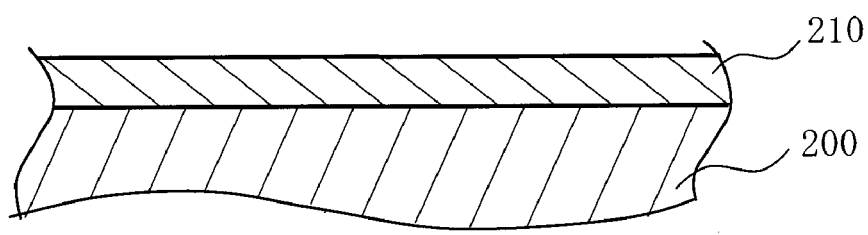
FIGS. 2A to 2D illustrate, in cross-section, device structures obtained at some major steps of the flow chart shown in FIG. 1.

Firstly, as shown in FIG. 2A, by known CVD methods a SiN thin-film is deposited on a top surface of substrate 200 (which is an example of base body) to a predetermined thickness of about 100 to 200 nanometers (nm), for example, thereby forming a downside SiN film 210. The CVD process may alternatively be replaced by other similar suitable processes. The substrate 200 may typically be a silicon (Si) wafer with a diameter of 300 millimeters (mm). On the top surface of Si substrate 200, a layer of gate electrode material may be formed, which is made of gate oxide film material and poly-Si or else. This layer may alternatively be other similar suitable layers.

Figure 2B:
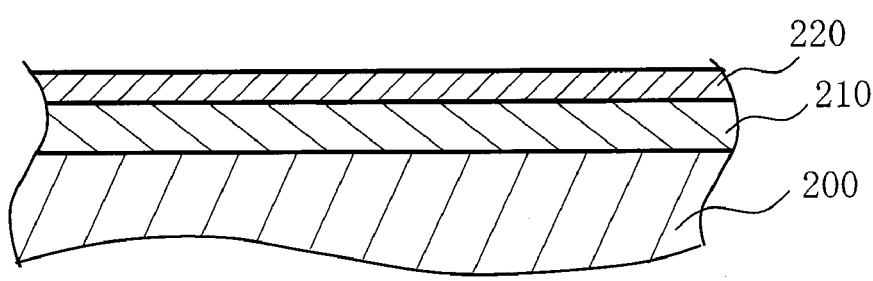

Then, as shown in FIG. 2B, by CVD a poly-Si thin-film 220 is deposited on the SiN film 210 to a thickness of about 10 to 20 nm. This film formation may alternatively be performed by suitable equivalent techniques other than the CVD.

Figure 2C:
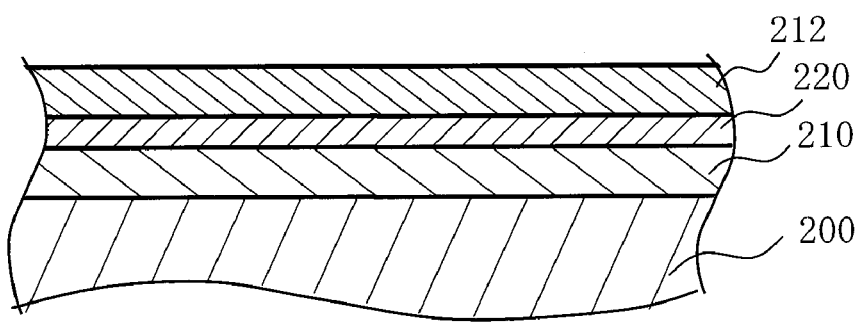

Next, as shown in FIG. 2C, by CVD a SiN thin-film 212 is deposited on the poly-Si film 220 to a thickness of about 100 to 200 nm. The film 220 is an upside SiN film. This film formation also is achievable by similar suitable techniques other than the CVD.

Figure 2D:
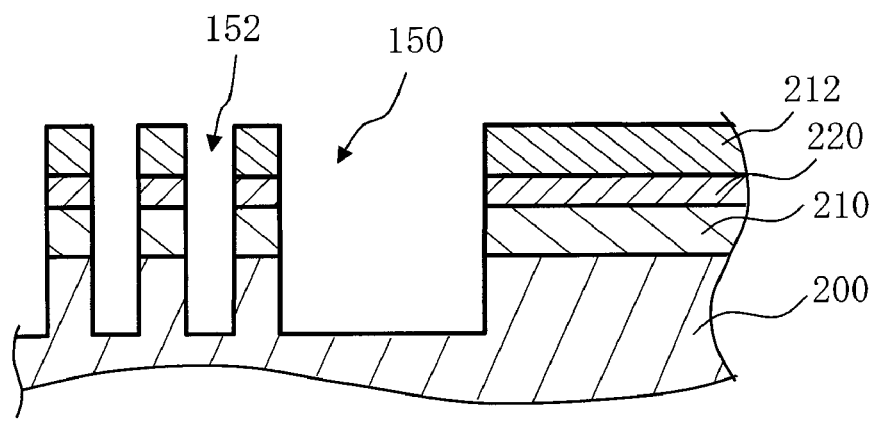

Subsequently, as shown in FIG. 2D, by using known lithography and dry etch techniques recesses 150 and 152 are defined in the SiN film 212, poly-Si film 220, SiN film 210 and the surface of substrate 200. Each of these recesses is a groove or "trench" for formation of the so-called shallow trench isolation (STI) structure. These STI trenches 150 and 152 extend from the upside SiN film 212 to inside of the surface of substrate 200. As can be seen from FIG. 2D, one STI trench 150 is greater in width than the other STI trenches 152. There, through known lithography including photoresist deposition and exposure processes, a resist film (not shown) is formed on the upside SiN film 212. The resultant multilayer structure is then subjected to anisotropic etching. At this etching step, exposed portions of the SiN film 212 and its underlying portions of poly-Si film 220, lower SiN film 210 and substrate 200 are selectively removed away to thereby form the STI trenches 150 and 152, which almost vertically extend with respect to the surface of substrate 200. The anisotropic etching here may be performed by reactive ion etch (RIE) techniques.

Figure 3A:
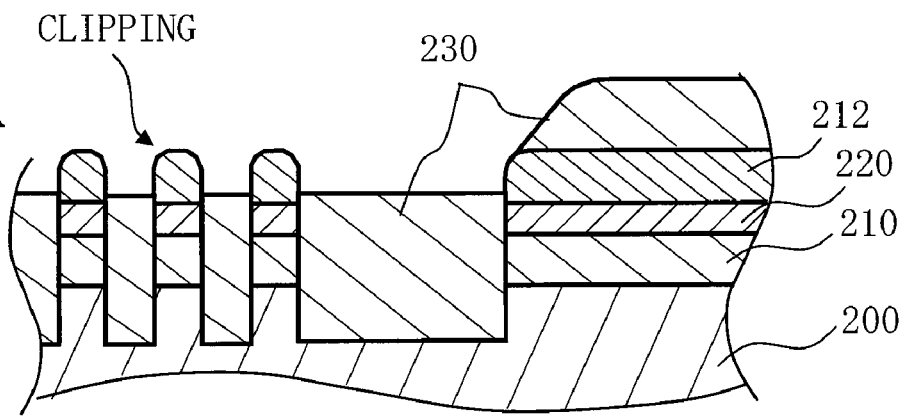
FIGS. 3A to 3C illustrate, in cross-section, device structures obtained at other major steps of the flowchart of FIG. 1.
Figure 3B:
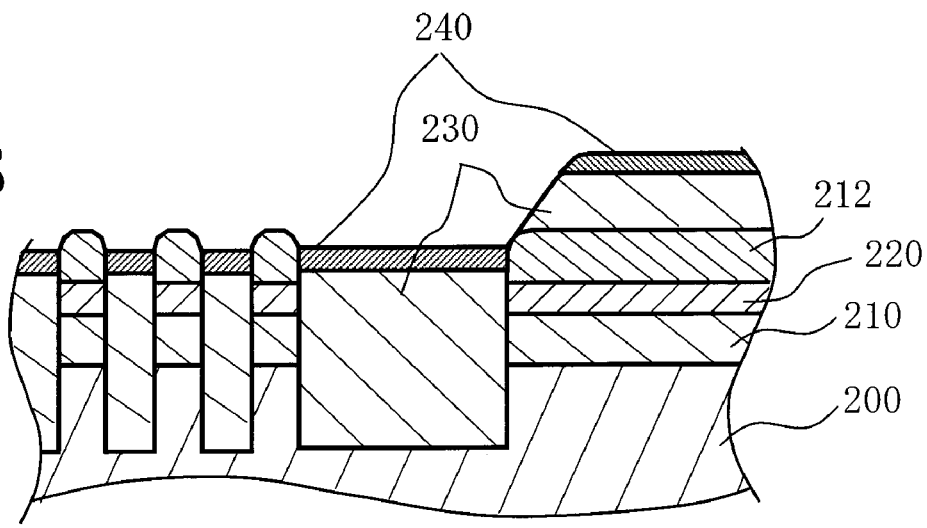
Figure 3C:
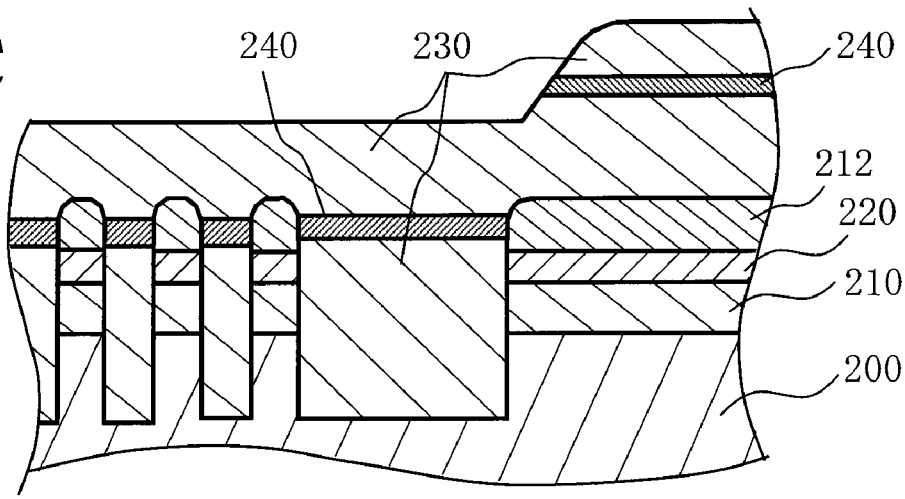

FIGS. 3A to 3C illustrate, in cross-section, device structures which are obtained at three sub-steps included in the dielectric film formation step S110—i.e., $SiO_2$ film formation step S112 to $SiO_2$ film formation step S116—of the fabrication process shown in the flowchart of FIG. 1. At the dielectric film formation step S110, by HDP-CVD a silicon-containing dielectric film 230 is formed on the upside SiN film 212 and within the STI trenches 150 and 152 in such a way that a Si-rich layer which is higher in silicon content than the other layer with in the silicon-containing dielectric film 230 is formed at a height position that is spaced apart from the portions of substrate 200 within STI trenches 150 and 152.

More specifically, as shown in FIG. 3A, HDP-CVD processing is performed by using an inductively coupled plasma CVD apparatus to thereby form the $SiO_2$ film 230 on the SiN film 212 and also in STI trenches 150 and 152. In STI trenches 150 and 152, $SiO_2$ film 230 is formed so that its surface is at a level corresponding to a mid point along the thickness of film 212. In other words, the buried $SiO_2$ film 230 in each STI trench 150, 152 has its surface, which is positioned between top and back surfaces of SiN film 212.

Figure 4:
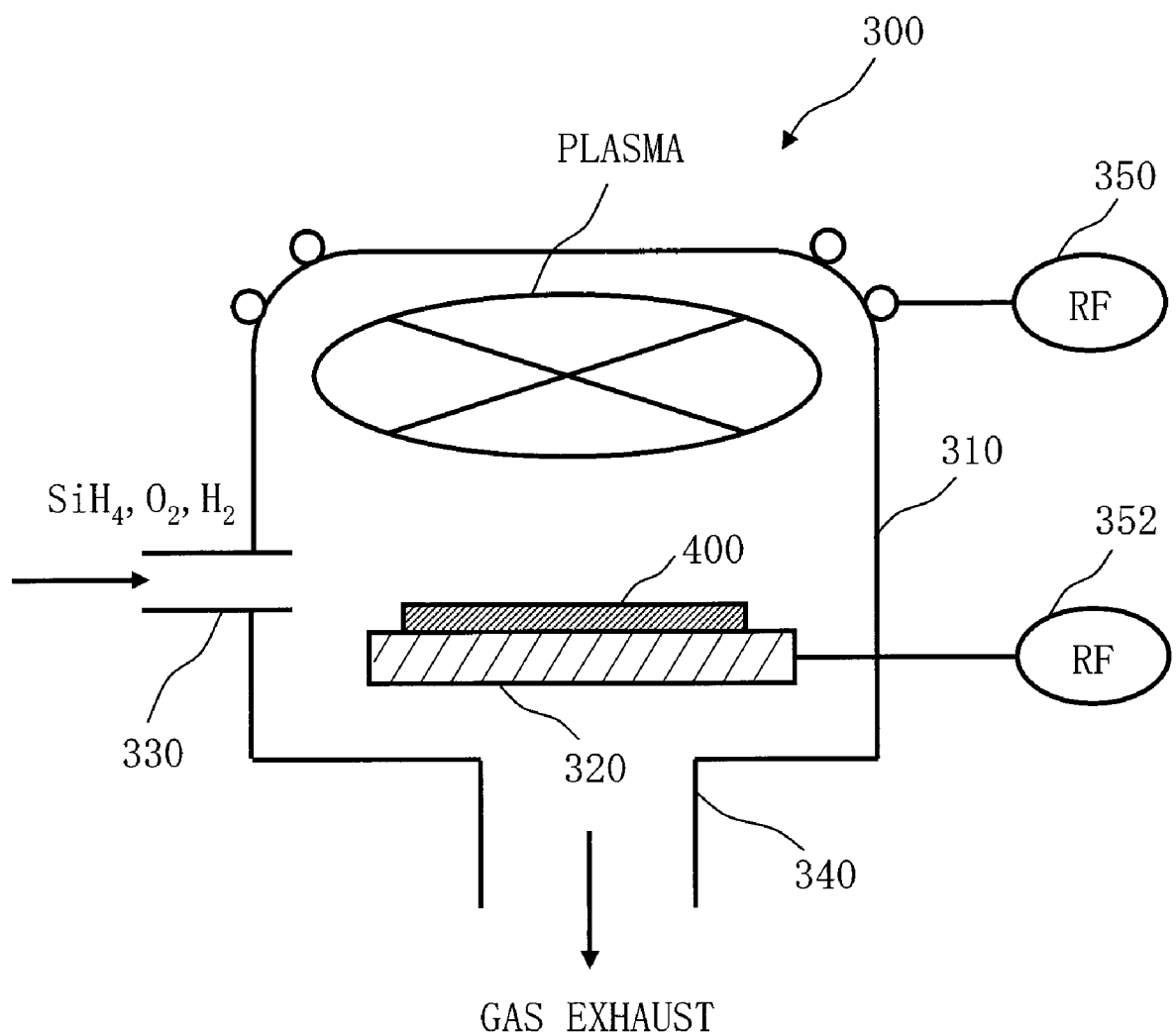
FIG. 4 is a diagram schematically showing a sectional view of a plasma-enhanced chemical vapor deposition (PECVD) apparatus of the inductive coupling type, which is for use with the semiconductor device fabrication method of FIG. 1.

A structure of main part of the inductive coupled PECVD apparatus is schematically shown in FIG. 4, which is indicated by reference numeral 300. This PECVD apparatus 300 includes a processing chamber 310 having a rounded upper cover member of the dome shape—say, dome roof. In this chamber 300, a stage 320 is disposed, which is arranged to function also as an electrode. A coil-shaped antenna is laid out at upper part of the dome-roofed chamber 310. This antenna is connected to a radio-frequency (RF) power supply unit 350. Another RF power supply 352 is also provided, which is connected to the stage 320. A workpiece 400 for formation of a dielectric film—here, substrate—is placed on stage 320. This substrate 400 has thereon the STI trenches 150 and 152 which have already been formed through the above-noted processes. Upon application of source power to the antenna from RF power supply 350, bias power is given to stage 320 from RF power supply 352. A processing gas, e.g., a mixture gas of $SiH_4$, $O_2$ and $H_2$, is supplied to the interior space of chamber 310 from a gas feed port 330. Gas components within chamber 310 are to be exhausted by a vacuum pump (not shown) through a gas exhaust port 340. Preferably, the process gas contains therein $SiH_4$ of 0.027 Pa·$m^3$/second (16 sccm), $O_2$ of 0.068 Pa·$m^3$/sec (40 sccm), and $H_2$ of 1.69 Pa·$m^3$/sec (1000 sccm). An inner pressure of chamber 310 is set at 1.266 Pa (9.5 mTorr) as an example. The source power is set, for example, to 9 kW whereas the bias power is at 6 kW. Under these process conditions, film deposition and sputtering are performed substantially simultaneously to thereby form the intended film(s). Especially, using $H_2$ as the process gas makes it possible to achieve the film formation while suppressing unwanted opening blockage otherwise occurrable due to the overhang. This in turn makes it possible to improve the buriability of dielectric material in STI trenches 150 and 152. When simultaneously performing the sputtering during the formation of $SiO_2$ film in this way, clipping can take place at certain portions of SiN film 212 which reside at edges or "shoulders" of STI trenches 150 and 152 as stated previously.

Turning back to the explanation of the fabrication process embodying the invention, after having obtained the device structure shown in FIG. 3A, continuously using the inductively coupled PECVD apparatus of FIG. 4 a silicon-excessive (oxygen-deficient) silicon oxide ($SiO_x$, where x<2) film 240 is formed on surface portions of the $SiO_2$ film 230 which were formed within the STI trenches 150 and 152 to a prespecified height corresponding to a mid point along the thickness of SiN film 212 as shown in FIG. 3B. This "silicon-rich" $SiO_x$ film 240 is formed to have a thickness that does not exceed the height of the top surface of SiN film 212. The Si-rich $SiO_x$ film 240 thus formed has its lower or back surface which is higher than the back surface of SiN film 212 and a top surface that is lower in level is than the top surface of SiN film 212. In other words, the Si-rich $SiO_x$ film 240 is formed at a specific position at which this film is able to come into close contact with SiN film 212 even when clipping occurs at SiN film 212. The formation of this Si-rich film 240 is in order to prevent the upper and lower separate portions of $SiO_2$ film 230 from being at least partially brought into contact with each other when additionally forming an $SiO_2$ film 230 (to be later described) on the Si-rich film 240 even where clipping occurs at SiN film 212. More precisely, the Si-rich film 240 is formed, during deposition of its underlying $SiO_2$ film 230, by increasing the flow rate of the process gas that was used for deposition of such $SiO_2$ film 230, i.e., $SiH_4$ gas, alternatively, by decreasing the flow rate of $O_2$ gas, or still alternatively, by increasing the flow rate of $H_2$ gas. It has been experimentally affirmed that the intended film fabrication was attained by increasing $SiH_4$ gas from 0.027 Pa·$m^3$/sec (16 sccm) up to 0.042 Pa·$m^3$/s (25 sccm) by way of example. A boundary condition appears to exist therebetween. It is also made sure that the film fabrication was attained by decreasing $O_2$ gas to 0.061 Pa·$m^3$/s (36 sccm). It is further revealed that similar results were obtained by increasing $H_2$ gas to 2.53 Pa·$m^3$/s (1500 sccm). It has been affirmed that the intended film formation is well achievable by appropriate increase/decrease adjustment of the gas feed rate in this way. Each gas amount may be properly designable in relation to other gas amounts on a case-by-case basis in practical applications.

Next, as shown in FIG. 3C, an $SiO_2$ film 230 is additionally formed on the Si-rich $SiO_x$ film 240 with continuous use of the inductive coupled PECVD apparatus. The additional formation of the $SiO_2$ film that is the same as the previously formed $SiO_2$ film beneath Si-rich $SiO_x$ film 240 is performed by returning the process conditions after having the Si-rich film 240 at the prespecified position. This additional $SiO_2$ film formation results in the STI trenches 150 and 152 being fully buried thereunder as shown in FIG. 3C.

In the way stated above, the Si-rich $SiO_x$ film 240 is formed while the Si-containing dielectric film, i.e., $SiO_2$ film 230, is being deposited. This Si-rich layer is formable by controlling the feed rate of a gas being supplied during formation of the Si-containing dielectric film 230 within the STI trenches 150 and 152. In wide areas with none of these trench grooves defined therein, the Si-rich film 240 is formed during deposition of the $SiO_2$ film 230 on or above the SiN film 212 as shown in FIG. 3C.

See FIGS. 5A-5D, which illustrate in cross-section some device structures which are formed at the $SiO_2$ film etching step S118 to planarization step S124 in the fabrication process shown in the flowchart of FIG. 1.

Figure 5A:
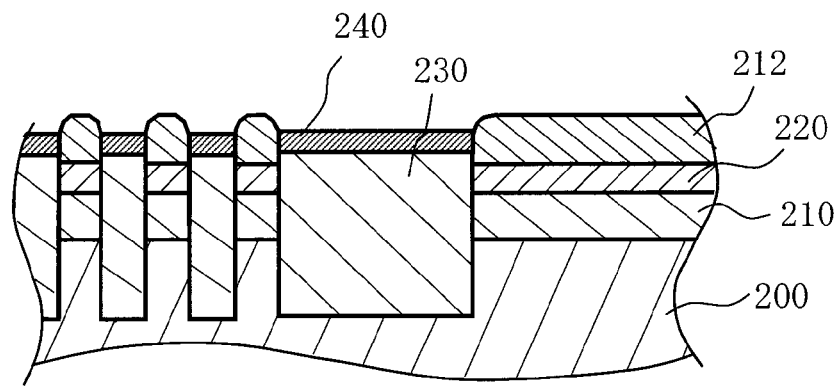
FIGS. 5A-5D illustrate, in cross-section, device structures obtained at the other major steps of the flowchart of FIG. 1.

As shown in FIG. 5A, selected portions of the $SiO_2$ film 230 which were deposited on the SiN film 212 and Si-rich $SiO_x$ film 240 other than those buried in the STI trenches 150 and 152 are etched away. This selective removal is done by putting the substrate surface into a chosen etchant solution. The etchant used may be an $SiO_2$ film etchable chemical solution, such as hydrofluoric (HF) acid, ammonium fluoride ($NH_4F$) or a mixture thereof (e.g., buffered HF or "BHF"). The etching removal of $SiO_2$ film 230 deposited may alternatively be achievable by execution of processing for supplying this etchant solution to the substrate surface. During this etch removal, the Si-rich film 240 and SiN film 212 function as an etch stop layer for acceleration of removal of the portions of $SiO_2$ film 230 overlying these films. As the Si-rich film 240 is formed at the position in contact with the SiN film 212, the $SiO_2$ film 230 that underlies Si-rich film 240 is not etched away. Accordingly, even if a gate oxide film is formed on the surface of substrate 200, this gate oxide film is prevented from being etched through the $SiO_2$ film 230 underlying the Si-rich film 240.

Figure 5B:
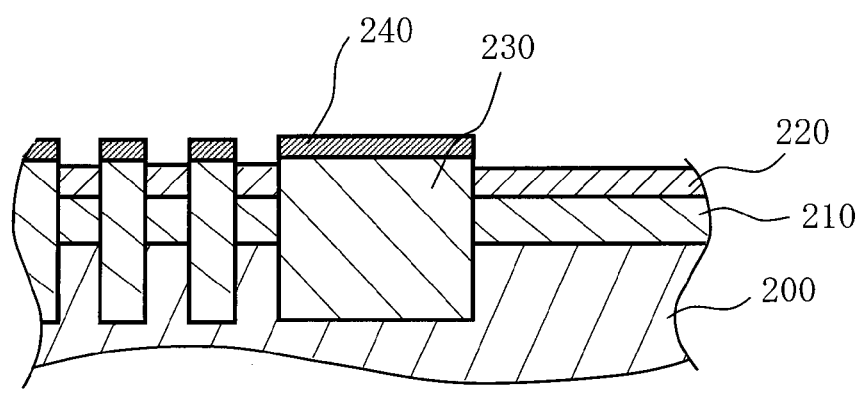

Next as shown in FIG. 5B, the upside SiN film 212 is removed away by etching from the resultant device structure by putting the substrate surface into a SiN film etchable solution, such as a "hot" phosphoric acid at a temperature of 150° C. or above. This etching removal of upside SiN film 212 may alternatively be performed while at the same time supplying such etchant solution to the substrate surface. Through this etching, the upper SiN film 212 on poly-Si film 220 is removed away. An example of the etchant here is a chemical solution having the selectivity with respect to $SiO_2$ film. This is preferable from a viewpoint of prevention of etch-away of the $SiO_2$ film 230 buried in STI trenches 150 and 152 as covered with its overlying Si-rich $SiO_x$ film 240. By this treatment, the poly-Si film 220 acts as an etch stopper, permitting only the clipping-occurred SiN film 212 to be removed away.

Figure 5C:
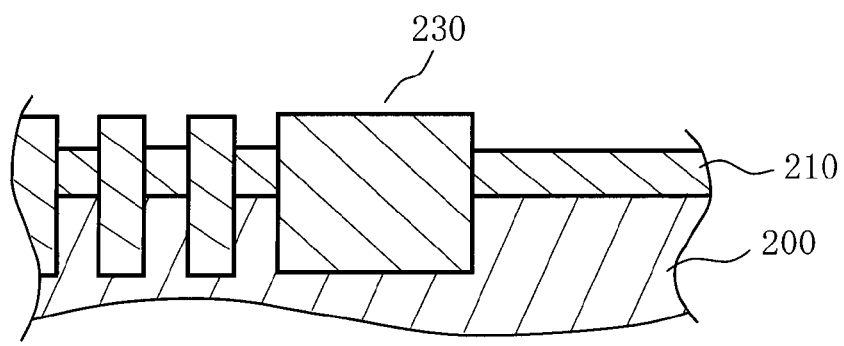

Subsequently, as shown in FIG. 5C, the poly-Si film 220 and Si-rich $SiO_x$ film 240 are etched away by putting the substrate surface into a chosen etchant solution which is high in etching selectivity ratio of poly-Si and Si-rich films with respect to $SiO_2$ film, such as fluoro-nitric acid (e.g., $HF:HNO_3:H_2O=1:1:100$), potassium hydroxide (KOH), tetramethyl-ammonium hydroxide (TMAH) or else. This etching removal of poly-Si film 220 and Si-rich film 240 may alternatively be performed while at the same time supplying this solution to the substrate surface. With this processing, portions of the poly-Si film 220 residing on SiN film 210 and portions of Si-rich film 240 on $SiO_2$ film 230 are all removed away. This treatment is effective in avoiding a risk that the $SiO_2$ film 230 becomes difficult in being polished at the planarization step S124 to be later performed.

Through the processes stated above, a device structure having an STI structure such as shown in FIG. 5C is formed. If the portion of $SiO_2$ film 230 which was buried in the width-increased or "wide" STI trench 150 is substantially the same in thickness as those portions of $SiO_2$ film 230 that were buried in "narrow" STI trenches 152, CMP processing may be skipped. For example, when the Si-rich $SiO_x$ film 240 on the $SiO_2$ film 230 within wide STI trench 150 and the Si-rich film 240 on $SiO_2$ film 230 in each narrow trench 152 are such that their lower surfaces are formed at the same height position, it is possible to cause the both trenches 150 and 152 to be substantially the same as each other in height of $SiO_2$ film 230, i.e., top surface level thereof, thereby making it possible to skip the CMP surface planarization to be later performed. This leads to cost reduction. In addition, arranging the SiN film to have two-layered structure ensures that no appreciable clipping takes place at the underlying SiN film 210. Accordingly, there are no serious problems even upon occurrence of clipping at the overlying SiN film 212. Thus it is possible to reduce strictness and complexity as to the settings of burying conditions of dielectric film in STI trenches 150 and 152. This makes it possible to improve the dielectrics burying performance at these trench grooves. This in turn makes it easier to permit $SiO_2$ film components in these trenches to be aligned or "flush" with each other at top surfaces thereof. If the top surface levels of the trench-buried portions of the $SiO_2$ film 230 are different from each other to an extent that a difference therebetween goes beyond a prespecified allowable value, surface planarization will be performed in a way which follows.

Figure 5D:
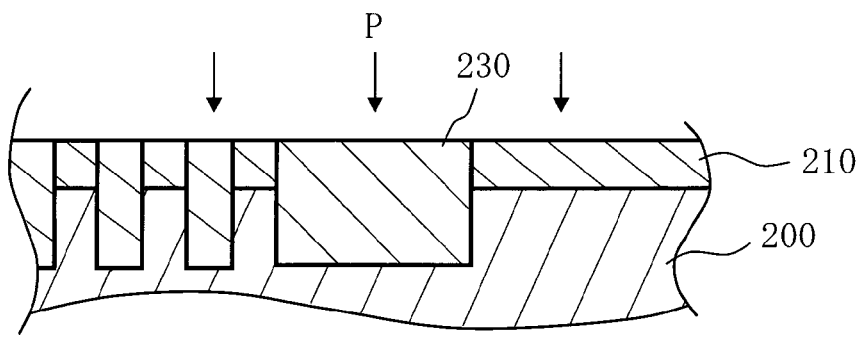

As shown in FIG. 5D, the top surface of substrate 200 is polished by CMP techniques in such a way as to remove extra protuberant portions of the $SiO_2$ film 230 which are projected from STI trenches 150 and 152, with the SiN film 210 being as a CMP stopper. In FIG. 5D, "P" indicates polishing pressure applied. By this surface polishing, the buried portion of $SiO_2$ film 230 within wide STI trench 150 and the buried portion of $SiO_2$ film 230 in each narrow trench 152 are planarized so that their top surfaces are flush with each other. As previously stated, since the upside SiN film 212 and downside SiN film 210 are formed with the poly-Si film 220 sandwiched therebetween, no appreciable clipping takes place at the lower SiN film 210. This makes it possible to avoid overpolishing of the dielectric film during planarization, which is otherwise occurrable due to clipping at the CMP stopper. Through the respective processes stated above, an STI structure with flat top surface is completed.

In this embodiment, the position of the lower surface of Si-rich $SiO_x$ film 240 may be lower than the upper surface of poly-Si film 220 as far as it is kept higher than the top surface of substrate 200. The reason for designing the lower surface of Si-rich film 240 to be higher than the substrate top surface is as follows. By forming the Si-rich film 240 at the position spaced apart from substrate 200, it is possible to prevent the semiconductor substrate material, e.g., Si, from being undesirably etched during etching removal of Si-rich film 240. In case the lower surface of Si-rich film 240 is arranged to be lower than the upper surface of poly-Si film 220, it becomes possible to more reliably avoid unwanted contact between the upper and lower $SiO_2$ films 230 otherwise occurring due to clipping effects, even when the upper SiN film 212 is made thinner. If necessary, the Si-rich film 240 may be designed so that its upper surface is set at a height position that is lower than the upper surface of poly-Si film 220.

Although in the above-stated example the $SiO_2$ film 230 was formed to overlie the portions of Si-rich $SiO_x$ film 240 which are buried in STI trenches 150 and 152 at the step S116 of FIG. 1 as shown in FIG. 3C, this $SiO_2$ film formation may be omitted in some cases. In such cases, obviously, no $SiO_2$ film 230 is formed on Si-rich film 240. Thus, the device structure shown in FIG. 5A is fabricatable by removing the $SiO_2$ film 230 overlying SiN film 212 with SiN film 212 as an etch stop layer at the $SiO_2$ film etching step S118. Its subsequent process is similar to that stated supra.

EMBODIMENT 2

While in the previous embodiment the two, upper and lower SiN films 210 and 212 are formed, the upper SiN film 212 may be omitted to thereby provide an STI trench structure with a single SiN layer. A method of fabricating a semiconductor device having this trench structure will be described below.

Figure 6:
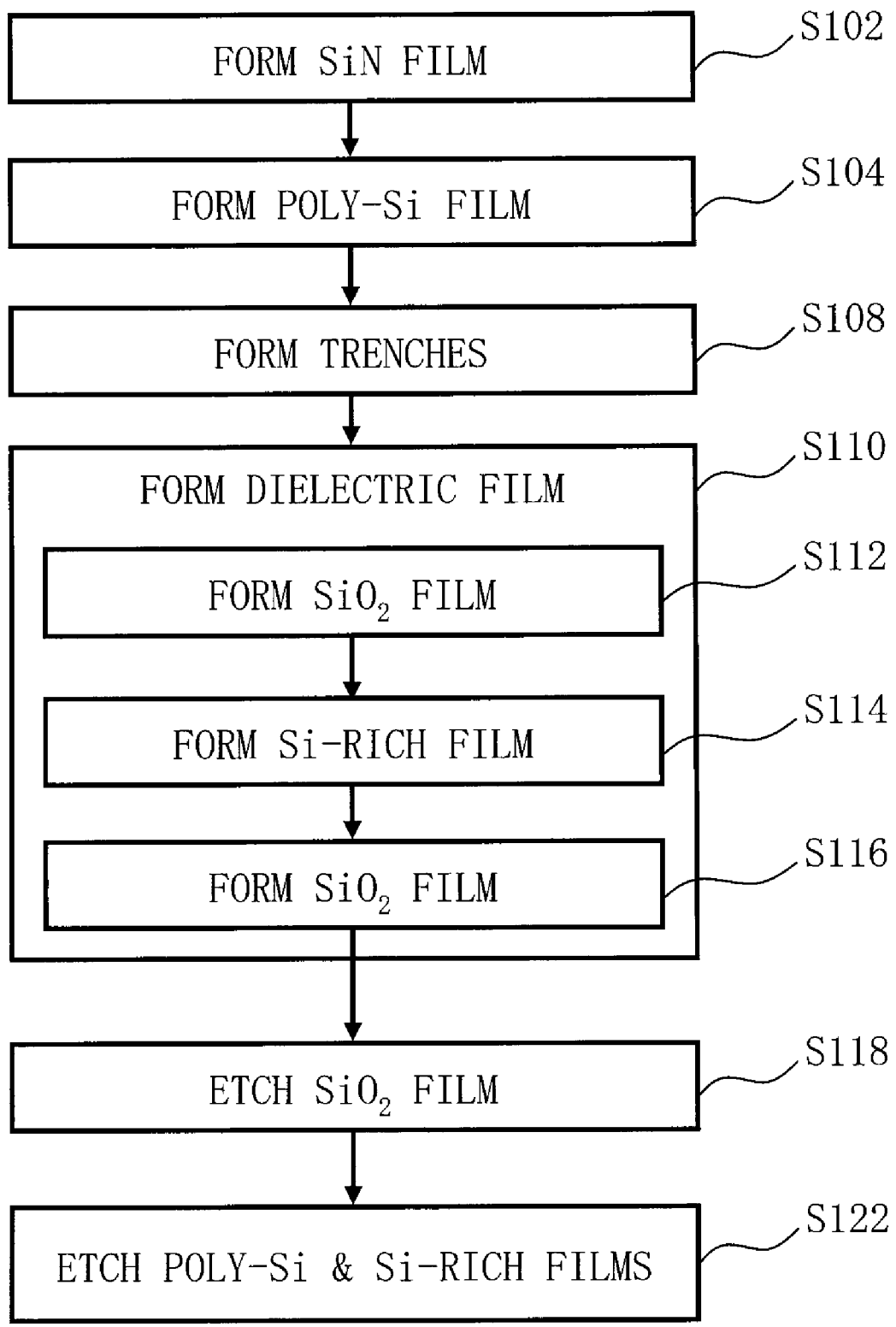
FIG. 6 is a flow diagram showing major steps of a semiconductor device fabrication method in accordance with another embodiment of the invention.

As shown in FIG. 6, this embodiment method includes a serial sequence of SiN film formation step S102, poly-Si film formation step S104, trench groove forming step S108, dielectric film formation step S110, $SiO_2$ film etching step S118, and poly-Si/S-rich film etching step S122. The dielectric film formation step S110 includes $SiO_2$ film formation sub-step S112, Si-rich layer forming substep S114, and $SiO_2$ film formation substep S116. This method is similar to that shown in FIG. 1 with the SiN film formation step S106 and SiN film etching step S120 plus planarization step S124 of FIG. 1 being omitted. A device structure obtained after completion of the poly-Si film formation step S104 is similar to that shown in FIG. 2B.

Figure 7A:
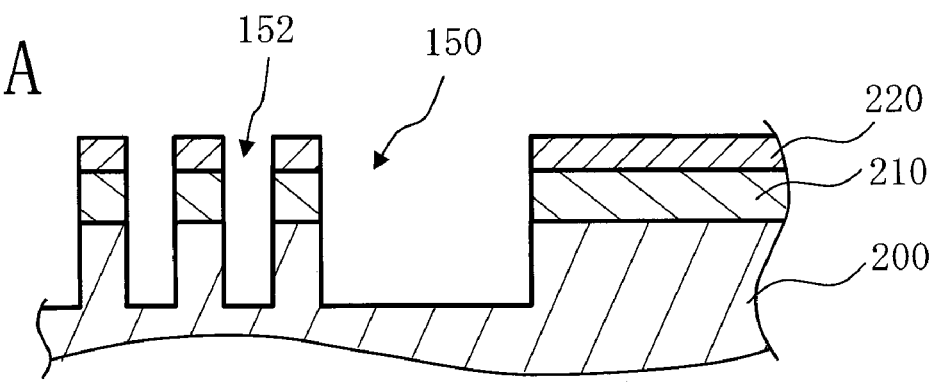
FIGS. 7A to 7C illustrate, in cross-section, device structures obtained at some major steps of the flowchart shown in FIG. 6.
Figure 7B:
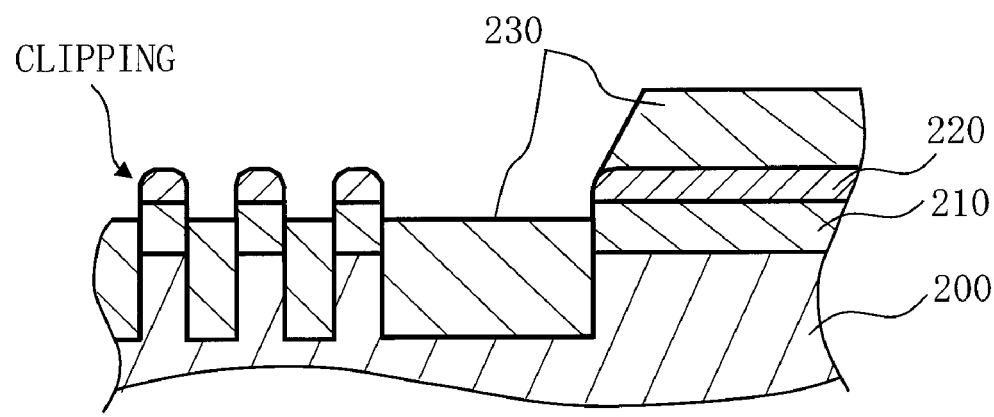
Figure 7C:
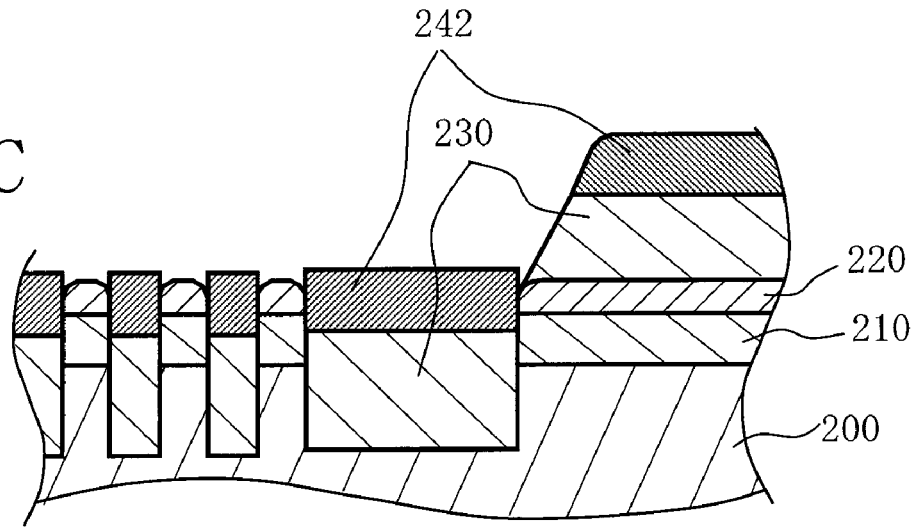

FIGS. 7A to 7C illustrate, in cross-section, device structures which are obtained at some of the process steps shown in the flowchart of FIG. 6, i.e., the groove forming step S108 to the Si-rich layer formation step S114.

As shown in FIG. 7A, in a similar way to the embodiment 1, by using known lithography and dry etch techniques trench-like grooves 150 and 152 are defined in a poly-Si film 220, SiN film 210 and surface of substrate 200. These grooves are for use as STI trenches, each extending from the SiN film 212 to inside of the surface of substrate 200.

Then, as shown in FIG. 7B, an $SiO_2$ film 230 is formed on the poly-Si film 220 and in STI trenches 150 and 152, by using the inductively coupled PECVD apparatus shown in FIG. 4. This $SiO_2$ film formation is similar to that in the embodiment 1 stated supra. This film 230's portions which are buried in STI trenches 150 and 152 have top surfaces that are placed at a level corresponding to a mid point along the thickness of SiN film 210, that is, the level between upper and lower surfaces of SiN film 210. More precisely, the height of top surface of trench-buried $SiO_2$ film 230 is higher than the lower surface of SiN film 210 and yet lower than upper surface of film 210. Since sputtering is simultaneously performed during formation of $SiO_2$ film, clipping can take place at parts of poly-Si film 220 residing at "shoulder" portions of STI trenches 150 and 152 as in the embodiment 1.

Subsequently, as shown in FIG. 7C, Si-rich dielectric layer formation is performed in a similar way to the embodiment 1. More specifically, by continuously using the inductive coupled PECVD tool, a silicon-excessive (oxygen-deficient) $SiO_x$ film 242 is formed on exposed surface portions of the $SiO_2$ film 230 buried in the STI trenches 150 and 152 in such a manner that these are budged from trenches 150 and 152. Very importantly, this film formation is done to ensure that the "silicon-rich" $SiO_x$ film 242 is formed to have its lower surface which is at a level between upper and lower surfaces of SiN film 210 and also have a top surface which is higher than upper surface of poly-Si film 220. The Si-rich film 242 formed is placed at a position at which it is in contact with SiN film 210. Use of this structural design prevents upper and lower separate portions of $SiO_2$ film 230 from being at least partly brought into contact with each other when forming an $SiO_2$ film 230 (to be later described) on the Si-rich $SiO_x$ film 242 even upon occurrence of clipping at poly-Si film 220.

Figure 8A:
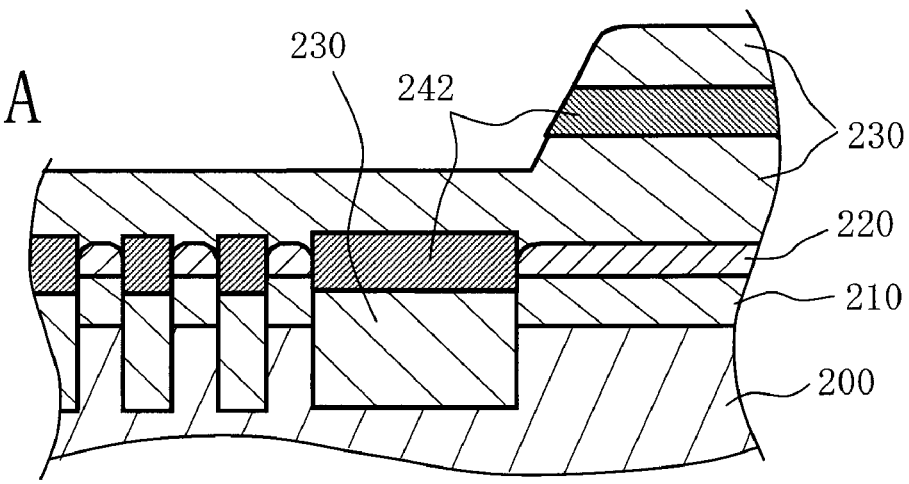
FIGS. 8A-8C illustrate, in cross-section, device structures obtained at other major steps of the flowchart of FIG. 6.
Figure 8B:
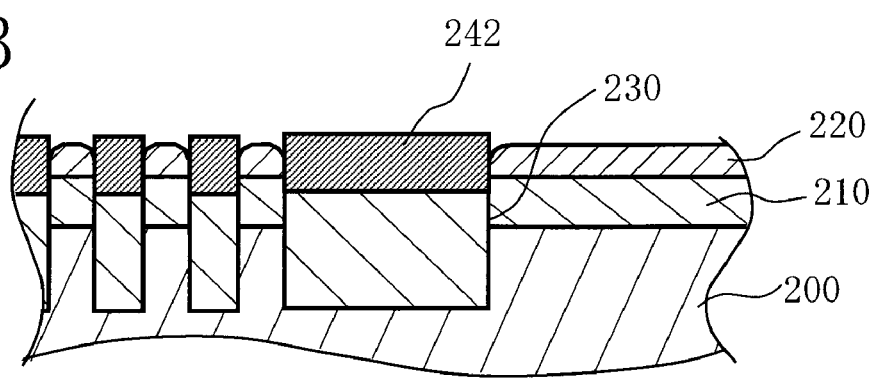
Figure 8C:
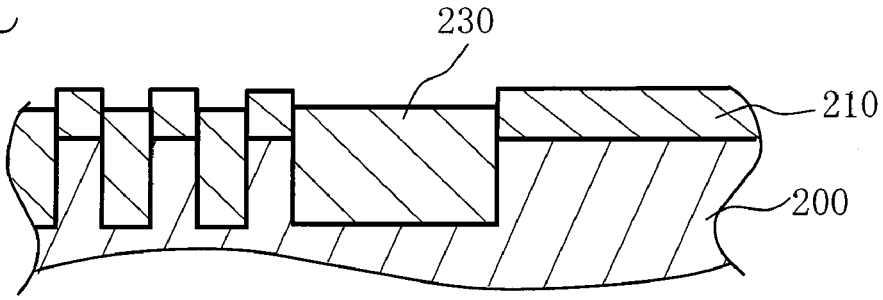

FIGS. 8A-8C illustrate, in cross-section, device structures which are obtained at some of the steps of the embodiment fabrication method shown in the flowchart of FIG. 6—i.e., from the $SiO_2$ film formation step S116 to poly-Si/Si-rich film etching step S122.

As shown in FIG. 8A, an $SiO_2$ film 230 is additionally formed on the resultant structure by continued use of the inductive coupled PECVD equipment so that it covers the Si-rich film 242. More specifically, after having selectively formed the Si-rich film 242 at the prespecified positions, the process conditions are turned back to their original setup values; then, the same $SiO_2$ film 230 as the preformed $SiO_2$ film 230 below Si-rich film 242 is formed. This additional $SiO_2$ film 230 fills STI trenches 150 and 152.

With this process, the Si-rich film 242 is formed in the process of depositing the $SiO_2$ film 230 in a similar way to the embodiment 1.

Next, as shown in FIG. 8B, the $SiO_2$ film 230 which was additionally deposited on the poly-Si film 220 and Si-rich $SiO_x$ film 242 other than the buried $SiO_2$ film components in the STI trenches 150 and 152 is etched away. This etching removal is done by putting the substrate surface into a chosen etchant solution. The etchant used may be an $SiO_2$ film etchable chemical solution, such as HF, $NH_4F$ or a mixture thereof (buffered HF or "BHF"). The etch removal of $SiO_2$ film 230 may alternatively be performed while simultaneously supplying this etchant solution to the substrate surface. During this etching, the Si-rich film 242 and poly-Si film 220 function as an etch stop layer for acceleration of removal of the portions of $SiO_2$ film 230 overlying these films. As the Si-rich film 242 is formed to extend to the position in contact with the SiN film 210, the $SiO_2$ film 230 that underlies Si-rich film 242 is not etched away. Accordingly, even if a gate oxide film is formed on the surface of substrate 200, this gate oxide film is prevented from being etched through the $SiO_2$ film 230 underlying the Si-rich film 242.

Figure 9:
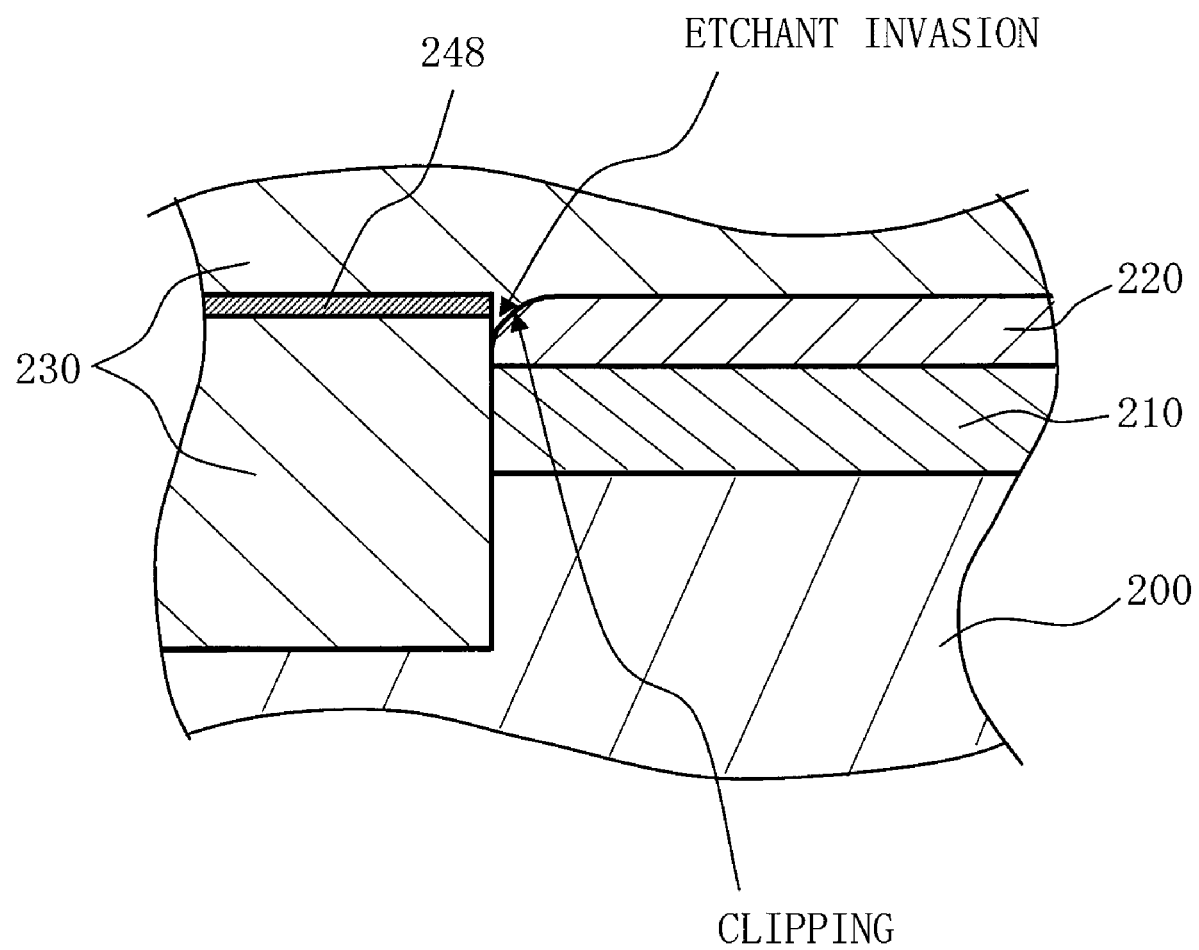
FIG. 9 is a diagram for explanation of a problem occurring in case a silicon-rich layer fails to be formed at a position at which this layer is in contact with a silicon nitride film underlying a polycrystalline silicon film.

See FIG. 9, which shows one example of a device structure having a Si-rich film 248 which was formed to fail to come into contact with SiN film 210 under poly-Si film 220. As previously stated, simultaneous execution of the sputtering during the formation of $SiO_2$ film 230 can readily result in occurrence of clipping at poly-Si film 220. In addition, as this poly-Si film is formed so that it is thinner than SiN film 210, the generation of clipping increases the risk that the upside and downside $SiO_2$ films 230 are contacted together. This contact between up and down layers leads to unintentional etch-away of the trench-buried $SiO_2$ film 230 under the Si-rich film 248 in the process of etching the $SiO_2$ film 230 on the Si-rich film 248. This problem is successfully avoidable in the embodiment 2. More precisely, by forming the Si-rich film 242 in each STI trench—this is like a "lid" of STI trench—in such a way that its edge portion is in full contact with SiN film 210, it is possible to reliably prevent the upside and downside $SiO_2$ films 230 from coming into contact with each other. Of course, the use of this structural feature does not always guarantee achievement of the ability to completely prevent the clipping otherwise occurrable at poly-Si film 220. However, even if the clipping takes place slightly at poly-Si film 220, no serious problems occur in practical applications. On the contrary, in the case of the poly-Si film 220 being formed thickly, Si-rich film 242 may be arranged so that its lower surface is higher in level than the upper surface of SiN film 210 as far as the process conditions are appropriately controlled to ensure that poly-Si film 220 is formed thick to an extent that Si-rich layer 242 is in close contact with poly-Si film 220 in the absence of appreciable gaps or voids therebetween.

Subsequently, as shown in FIG. 8C, the poly-Si film 220 and Si-rich film 242 are removed by etching. This etching removal is achievable by putting the substrate surface into a chosen etchant solution having higher selectivity for poly-Si and Si-rich films with respect to $SiO_2$ film, such as fluoronitric acid, KOH, TMAH or else. Similar etch removal is also attainable by supplying this chemical solution onto the substrate. In this way, the poly-Si film 220 on SiN film 210 and the Si-rich film 242 on trench-buried $SiO_2$ film 230 are etched away.

Through the process steps stated above, a device having the STI structure shown in FIG. 8C is completed. Although in this example the top surface of trench-buried $SiO_2$ film 230 is lower in level than the upper surface of SiN film 210, this device structure is still employable for practical applications as far as it is higher than the top surface of substrate 200. Additionally, supposing that the CMP planarization process is omitted, even when clipping takes place at poly-Si film 220, this poses no serious problems when reduction to practice. Thus it is possible to reduce complexity and strictness of dielectric film burying conditions with respect to STI trenches 150 and 152. This leads to improvements in insulator burying performance of is these trenches, thereby enabling more successfully the $SiO_2$ film components 230 buried in "wide" and "narrow" STI trenches 150 and 152 to be identical to each other in height of top surfaces thereof.

Although in the above-stated example the $SiO_2$ film 230 was formed to overlie the portions of Si-rich $SiO_x$ film 242 which are buried in STI trenches 150 and 152 at the step S116 of FIG. 6 as shown in FIG. 8A, this $SiO_2$ film formation may be omitted in some cases. In such cases, obviously, no $SiO_2$ film 230 is formed on Si-rich film 242. Thus, the device structure shown in FIG. 8B is fabricatable by removing the $SiO_2$ film 230 overlying poly-Si film 220 with this film 220 as an etch stop layer at the $SiO_2$ film etching step S118 of FIG. 6. Its subsequent process is similar to that stated supra.

Regarding the Si-rich film 242 in the embodiment 2 also, its top surface height position should not exclusively be limited to that stated above and may be modifiable on a case-by-case basis as far as this film is at a position spaced apart from the substrate 200. As an example, the film formation may alternatively be done in a way such that the Si-rich film's lower surface is higher than the top surface of substrate 200 and, at the same time, Si-rich film's upper surface is lower in level than the upper surface of poly-Si film 220. Note however that even in this case also, it is preferable to adequately control the process conditions to ensure that the Si-rich layer's lower surface is lower than the top surface of SiN film 210 and that this Si-rich layer is brought into contact with SiN film 210. A flowchart of a semiconductor device fabrication method in this case is similar to that shown in FIG. 6.

Figure 10A:
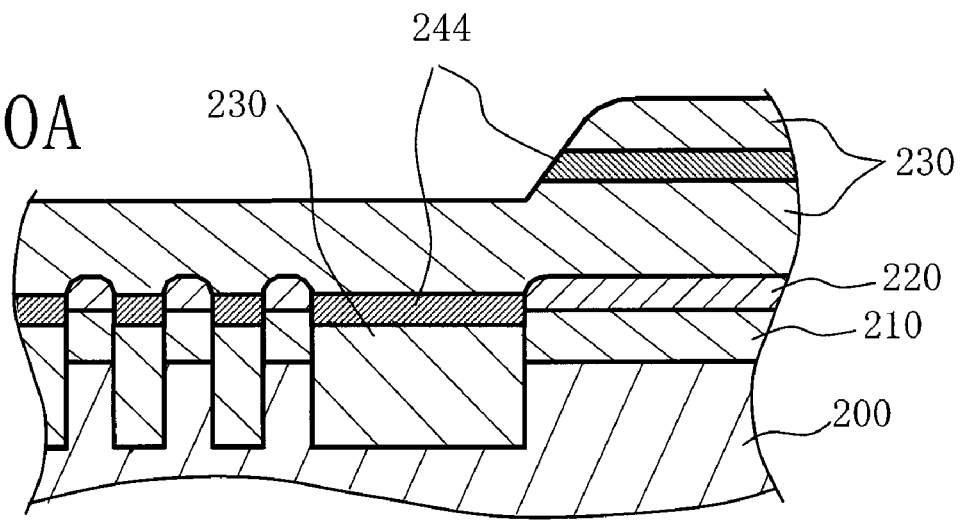
FIGS. 10A-10C depict, in cross-section, device structures obtained at the other major steps of the flowchart of FIG. 6.
Figure 10B:
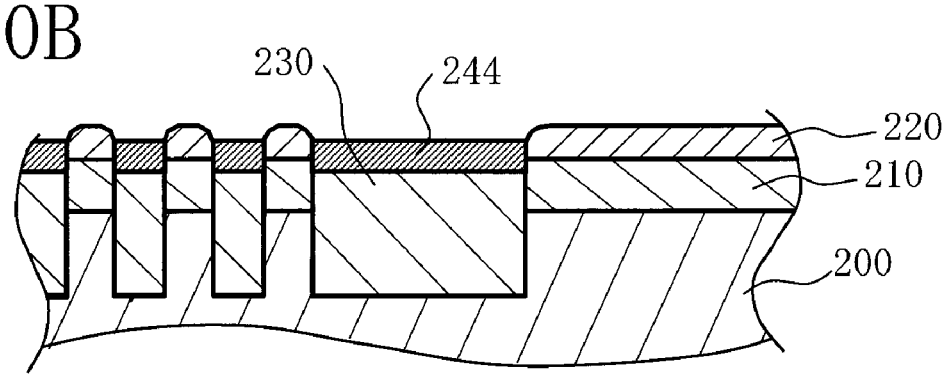
Figure 10C:
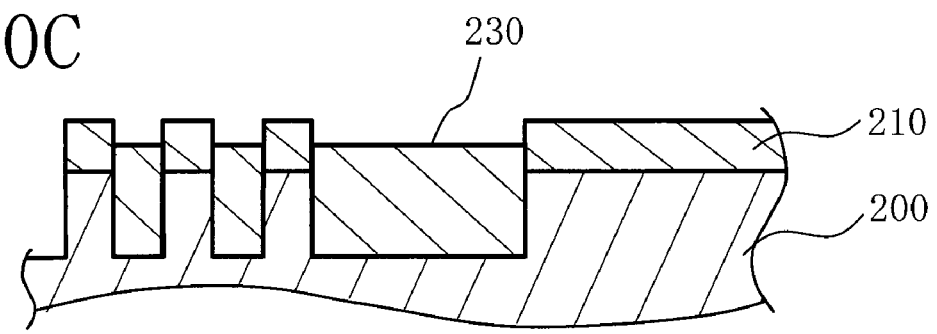

FIGS. 10A to 10C depict, in cross-section, device structures which are obtained at other process steps in the flowchart shown in FIG. 6, i.e., from the SiO$_2$ film forming step S116 to the poly-Si/Si-rich film etching step S122, respectively.

Processes corresponding to the SiN film formation step S102 to SiO$_2$ film forming step S116 are performed in a similar way to the above-stated procedure up to obtaining the device structure of FIG. 8A, except that a Si-rich dielectric film 244 to be formed in this example is different in formation position and thickness from the Si-rich film 242 stated supra. As a result, a structure shown in FIG. 10A is obtained.

Next, as shown in FIG. 10B, with the Si-rich SiO$_x$ film 244 and poly-Si film 220 being as an etch stopper, the upside SiO$_2$ film 230 residing on these films is removed. In this modified example of embodiment 2 also, the Si-rich film 244 is formed to have its edge portion which comes into close contact with SiN film 210. This is to prevent upside and downside SiO$_2$ films 230 from coming into direct contact with each other, thereby reliably avoiding unintentional etch-away of the underlying SiO$_2$ film in the process of etching the upside SiO$_2$ film 230 on Si-rich film 244. Subsequently, as shown in FIG. 10C, the poly-Si film 220 and the Si-rich film 244 in STI trenches are removed by etching. With the use of fabrication method also, it is possible to form the intended STI structure shown in FIG. 10C, which is similar to that shown in FIG. 8C.

Although in the above-stated example the SiO$_2$ film 230 was formed to overlie the portions of Si-rich SiO$_x$ film 244 which are in STI trenches as shown in FIG. 10A, this SiO$_2$ film formation may be omitted in some cases. If this is the case, obviously, any SiO$_2$ film 230 is not formed on Si-rich film 244. Thus, the device structure shown in FIG. 10B is fabricated by removing the SiO$_2$ film 230 overlying poly-Si film 220 with this film being used as an etch stop layer at the SiO$_2$ film etching step S118. Its subsequent process is is similar to that stated supra.

While the invention has been described with reference to specific embodiments, the description is illustrative of the invention and is not to be construed as limiting the invention. For example, although in the above-stated embodiments the Si-rich dielectric film was formed by controlling the flow rate of a chosen processing gas, this film is formable by another process having the steps of supplying a mixture of SiH$_4$ and O$_2$ plus H$_2$ gases as the process gas, and, after the elapse of a prespecified length of time, presetting adequate flow-rate setting that causes a resulting dielectric film to be Si-rich in its composition. After having formed such Si-rich film, the gas feed is temporarily stopped, and thereafter, a process gas may be again supplied under the same conditions. By use of this technique also, the two-layered SiO$_2$ films are fabricatable with the Si-rich film being sandwiched therebetween. Additionally the inductively coupled PECVD apparatus shown in FIG. 4, which is used for formation of SiO$_2$ film(s) by HDP-CVD techniques, is replaceable by other similar tools, including but not limited to electron cyclotron resonance (ECR) plasma-assisted CVD apparatus and helicon wave-excited plasma CVD equipment. While in the above-stated embodiments the trench grooves 150 and 152 are formed while using as a mask the SiN and poly-Si films stacked on or above the substrate, similar results are obtainable by replacing the poly-Si film with an amorphous silicon film.

As for the thicknesses of respective films along with sizes, shapes and numbers of the STI trench grooves, these may be modifiable in value in accordance with practical requirements in the manufacture of various types of ULSI devices and on-chip circuit elements thereof.

Any possible semiconductor devices and fabrication methods which comprise the subject matter of this invention and which are design-modifiable by a skilled person in the art on a case-by-case basis should be interpreted to be included within the scope of the invention.

Although in the description specific explanations and illustrations as to techniques or processes which are usually used in the semiconductor device industry, for example, photolithography processes and cleaning processes to be done as pre- and post-processing, are eliminated for purposes of brevity of explanation, it is appreciated that these processes may be implemented in known ways.

Additional advantages and modifications will readily occur to those skilled in the art. The invention in its broader aspects is not limited to the specific details and representative embodiments shown and described herein. Various alterations may be made without departing from the spirit or scope of the general inventive concept as defined by the appended claims and equivalents thereto.

What is claimed is:

1. A method for fabricating a semiconductor device, comprising:
    forming a first silicon nitride film on a base body;
    forming a silicon film on said first silicon nitride film;
    forming a second silicon nitride film on said silicon film;
    forming at least one groove extending from said second silicon nitride film to inside of said base body;
    forming by high-density plasma-enhanced chemical vapor deposition a silicon-containing dielectric film in said groove and on said second silicon nitride film in such a way that a silicon-rich layer is formed at a height position spaced apart from said base body within said groove, said silicon-rich layer being higher in silicon content than remaining silicon-containing dielectric film;
    removing by etching a portion of said silicon-containing dielectric film above said second silicon nitride film and a portion of said remaining silicon-containing dielectric film above said silicon-rich layer, if any;
    after having removed said silicon-containing dielectric film, removing by etching said second silicon nitride film; and
    after having removed said second silicon nitride film, removing by etching said silicon-rich layer and said silicon film.

2. The method according to claim 1, wherein said silicon-rich layer is formed at a level above said base body and a level below upper surface of said second silicon nitride film.

3. The method according to claim 1, wherein said silicon-rich layer is formed at a level at which a lower surface of said silicon-rich layer is higher than a lower surface of said second silicon nitride film and, at the same time, an upper surface of said silicon-rich layer is lower than an upper surface of said second silicon nitride film.

4. The method according to claim 1, wherein said silicon-rich layer is formed at a position whereat said silicon-rich layer is in close contact with said second silicon nitride film.

5. The method according to claim 1, wherein when forming said groove, a plurality of grooves including two grooves being different in width from each other are formed, and wherein said silicon-rich layer is formed so that its lower surfaces within said plurality of grooves are at substantially the same level.

6. The method according to claim 1, wherein said silicon-containing dielectric film is formed while supplying a chosen gas, and wherein said silicon-rich layer is formed by controlling a flow rate of the gas supplied when forming said silicon-containing dielectric film within said groove.

7. The method according to claim 6, wherein said chosen gas includes a mono-silane gas and wherein said silicon-rich layer is formed by increasing the flow rate of said mono-silane gas.

8. The method according to claim 6, wherein said chosen gas includes an oxygen gas and wherein said silicon-rich layer is formed by decreasing the flow rate of said oxygen gas.

9. The method according to claim 6, wherein said chosen gas includes a hydrogen gas and wherein said silicon-rich layer is formed by increasing the flow rate of said hydrogen gas.

10. The method according to claim 1, wherein said remaining silicon-containing dielectric film other than said silicon-rich layer is formed above and beneath said silicon-rich layer.

11. The method according to claim 1, wherein when forming said silicon-containing dielectric film, another silicon-rich layer is formed above said second silicon nitride film, and wherein said another silicon-rich layer is removed together when said silicon-containing dielectric film is removed away.

12. The method according to claim 1, further comprising:
after having removed said silicon-rich layer and said silicon film, polishing said silicon-containing dielectric film with said first silicon nitride film being as a stopper.

13. A method for fabricating a semiconductor device, comprising:
forming a silicon nitride film on a base body;
forming a silicon film on said silicon nitride film;
forming at least one groove extending from said silicon film to inside of said base body;
forming by high-density plasma-enhanced chemical vapor deposition a silicon-containing dielectric film in said groove and on said silicon film in such a way that a silicon-rich layer is formed at a height position spaced apart from said base body within said groove, said silicon-rich layer being higher in silicon content than remaining silicon-containing dielectric film;
removing by etching a portion of said silicon-containing dielectric film above said silicon film and a portion of said remaining silicon-containing dielectric film above said silicon-rich layer, if any; and
after having removed said silicon-containing dielectric film, removing by etching said silicon-rich layer and said silicon film.

14. The method according to claim 13, wherein said remaining silicon-containing dielectric film other than said silicon-rich layer is formed above and below said silicon-rich layer.

15. The method according to claim 13, wherein said silicon-rich layer is formed up to a level exceeding an upper surface of said silicon film.

16. The method according to claim 13, wherein said silicon-rich layer is formed to have a lower surface being lower in level than an upper surface of said silicon nitride film and higher in level than a lower surface of said silicon nitride film and also have an upper surface higher in level than an upper surface of said silicon film.

17. The method according to claim 13, wherein said silicon-rich layer is formed to have a lower surface higher in level than an upper surface of said base body and an upper surface lower than or equal in level to an upper surface of said silicon film.

18. The method according to claim 13, wherein said silicon-rich layer is formed at a position at which this layer is brought into contact with said silicon nitride film.

19. The method according to claim 13, wherein when forming said groove, a plurality of grooves including two grooves being different in width from each other are formed, and wherein said silicon-rich layer is formed so that its lower surfaces within said plurality of grooves are at substantially the same level.

20. The method according to claim 13, wherein said silicon-containing dielectric film is formed while supplying a chosen gas, and wherein said silicon-rich layer is formed by controlling a flow rate of the gas supplied when forming said silicon-containing dielectric film within said groove.

* * * * *